(12) United States Patent
Fantini

(10) Patent No.: US 10,475,995 B2
(45) Date of Patent: Nov. 12, 2019

(54) TIP-CONTACT CONTROLLED THREE DIMENSIONAL (3D) VERTICAL SELF SELECT MEMORY

(71) Applicant: Intel Corporation, Santa Clara, CA (US)

(72) Inventor: Paolo Fantini, Vimercate (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/853,697

(22) Filed: Dec. 22, 2017

(65) Prior Publication Data

US 2019/0044062 A1 Feb. 7, 2019

(51) Int. Cl.
*H01L 45/00* (2006.01)
*G11C 13/00* (2006.01)
*H01L 27/24* (2006.01)
*B82Y 40/00* (2011.01)
*B82Y 35/00* (2011.01)

(52) U.S. Cl.
CPC ........ *H01L 45/1233* (2013.01); *G11C 13/003* (2013.01); *G11C 13/0004* (2013.01); *H01L 27/249* (2013.01); *H01L 45/04* (2013.01); *H01L 45/06* (2013.01); *H01L 45/1226* (2013.01); *H01L 45/1273* (2013.01); *H01L 45/16* (2013.01); *H01L 45/1616* (2013.01); *H01L 45/1625* (2013.01); *B82Y 35/00* (2013.01); *B82Y 40/00* (2013.01); *G11C 13/0026* (2013.01); *G11C 2213/71* (2013.01); *G11C 2213/72* (2013.01); *G11C 2213/76* (2013.01); *H01L 27/2427* (2013.01); *H01L 45/144* (2013.01); *H01L 45/146* (2013.01); *H01L 45/149* (2013.01)

(58) Field of Classification Search
CPC . H01L 51/5012; H01L 51/56; H01L 51/5056; H01L 33/62; C09K 11/06
USPC ............................................................ 257/4
See application file for complete search history.

(56) References Cited

U.S. PATENT DOCUMENTS

| 9,379,321 | B1 | 6/2016 | Chang et al. |
| 9,741,768 | B1 | 8/2017 | Melik-Martirosian et al. |
| 2006/0141763 | A1* | 6/2006 | Brody ............... H01L 21/67173 438/622 |
| 2010/0109164 | A1* | 5/2010 | Kang ................. H01L 21/76898 257/774 |
| 2011/0177666 | A1 | 7/2011 | Nozawa |
| 2013/0153846 | A1 | 6/2013 | Chien et al. |
| 2013/0229846 | A1 | 9/2013 | Chien et al. |
| 2014/0061574 | A1 | 3/2014 | Pio |
| 2016/0099208 | A1* | 4/2016 | Chen ..................... H01L 23/522 257/532 |
| 2016/0133671 | A1 | 5/2016 | Fantini et al. |
| 2017/0287980 | A1 | 10/2017 | Fantini |

OTHER PUBLICATIONS

Extended European Search Report for U.S. Appl. No. 15/853,697, dated May 17, 2019, 8 pages.

* cited by examiner

*Primary Examiner* — Andy Huynh
(74) *Attorney, Agent, or Firm* — Compass IP Law, PC

(57) ABSTRACT

A variable resistance memory cell with a wide difference ("window") between threshold voltages is provided. The window between threshold voltages is increased by amplifying the stoichiometry gradient by means of an asymmetry in the memory cell architecture to provide a greater margin for detecting different logic states of the memory cell.

8 Claims, 8 Drawing Sheets

TIP-CONTACT CONTROLLED THREE DIMENSIONAL (3D) VERTICAL SELF SELECT MEMORY

FIELD

This disclosure relates to memory devices and in particular to three dimensional (3D) vertical Self Select Memory (SSM).

BACKGROUND

A memory device may include variable resistance memory cells which can be switched between high and low resistance states in direct or indirect response to an electrical signal, such as a voltage or a current pulse. A program operation also referred to as a RESET operation can change the resistance state of the memory cell from a relatively low resistance state to a relatively high resistance state. Similarly, an erase operation, also referred to as a SET operation, can change the resistance state of the memory cell from a relatively high resistance state to a relatively low resistance state.

BRIEF DESCRIPTION OF THE DRAWINGS

Features of embodiments of the claimed subject matter will become apparent as the following detailed description proceeds, and upon reference to the drawings, in which like numerals depict like parts, and in which:

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined only as set forth in the accompanying claims.

DESCRIPTION OF EMBODIMENTS

The variable resistance memory cells may be arranged in a cross-point array configuration with memory cells disposed and electrically connected at intersections between a first set of conductive lines (word lines) and a second set of conductive lines (bit lines) overlapping and crossing the first set of conductive lines.

One category of a variable resistance memory cells is a phase change memory cell. The electrical resistance of the phase change material in the memory cell can be changed by electrical signals provided through the word and bit lines. The variable resistance memory cell may be a low resistance crystalline state or a high resistance amorphous state, the state is used to represent whether the memory cell stores a logic (binary) '1' or logic (binary) '0'.

The logic state of the memory cell is detected by observing a threshold voltage at which the memory cell conducts current when the memory cell is read. A small difference between the threshold voltages may result in the incorrect logic state being read.

In an embodiment, the difference ("window") between threshold voltages is increased by amplifying the stoichiometry gradient by means an asymmetry in the cell architecture to provide a greater threshold voltage margin for detecting the different logic states.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Figure 1:
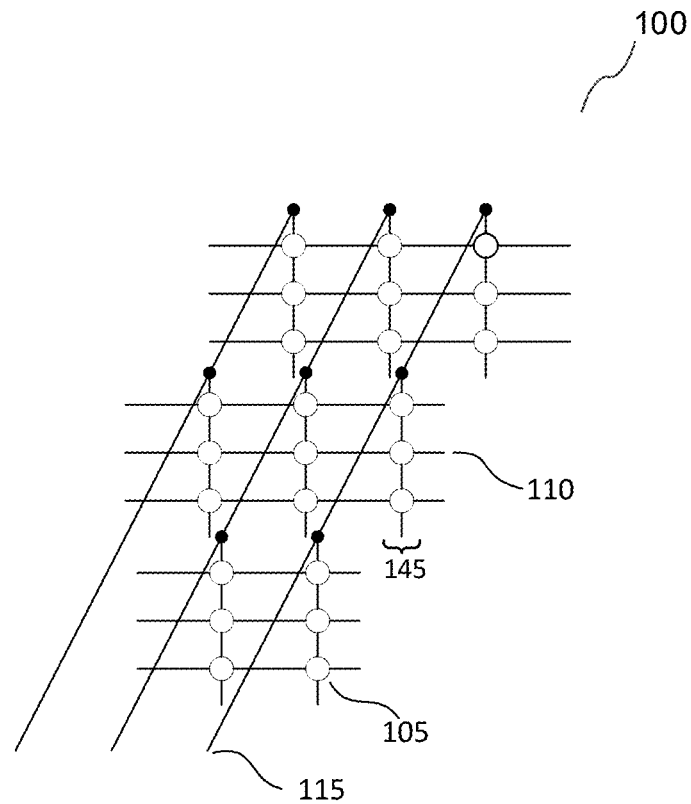
FIG. 1 is an embodiment of a cross point memory array that includes a plurality of memory cells.

FIG. 1 is an embodiment of a cross-point memory array 100 that includes a plurality of memory cells 105. In an embodiment, each memory cell 105 includes a material with a crystalline or an amorphous atomic configuration that may have different electrical resistances. A voltage applied to the memory cell 105 results in a different current dependent on whether the material is in a crystalline or an amorphous state, and the magnitude of the resulting current may be used to determine the logic state stored by memory cell 105.

Cross-point memory array 100 may be a three dimensional (3D) memory array that includes a plurality of levels of two-dimensional (2D) memory arrays formed on top of one another and separated by an electrically insulating material. In the embodiment shown in FIG. 1, cross-point memory array 100 includes three levels; however, the number of levels is not limited to three. The electrically insulating material may be thermally insulating and may contain multiple sublayers to increase the thermal resistance between each level. Each level may be aligned or positioned so that memory cells 105 may be approximately aligned with one another across each level, forming a memory cell stack 145.

Each row of memory cells 105 is connected to a word line 110, and each column of memory cells 105 is connected to a bit line 115 with a memory cell 105 located at the intersection of a word line 110 and a bit line 115. In an embodiment, word lines 110 and bit lines 115 may be substantially perpendicular to one another to create an array.

The memory cells 105 can function in a two-terminal architecture with a particular word line 110 and bit line 115 serving as the electrodes for the memory cells 105. Each memory cell 105 can be addressed individually allowing data to be written and read on a per-bit basis. Word lines 110 and bit lines 115 may be made of conductive materials, such as metals (for example, copper, aluminum, gold, tungsten, titanium), metal alloys, carbon, or other conductive materials, alloys, or compounds.

In operation, a memory cell 105 of cross-point memory array 100 can be written by applying a voltage, across the memory cell 105 via a selected word line 110 and bit line 115. A memory cell 105 of cross-point memory array 100 can be read by sensing current on a bit line 115 corresponding to the respective memory cell 105 responsive to a particular voltage applied to the selected word line 110 to which the respective memory cell is coupled.

The magnitude of the current sensed is dependent on the electrical resistance of the memory cell 105 and may be used to differentiate between the electrically resistive states of the phase change material. In some cases, sensing may depend on a threshold voltage $V^{th}$, a voltage at which point a current begins to flow.

The state of the memory cell 105 may be a low resistance crystalline state or a high resistance amorphous state, the state is used to represent whether the memory cell stores a logic (binary) '1' or logic (binary) '0'. In an embodiment, the low resistance state represents a logic '0' and the high resistance state represents a logic '1'.

Figure 2:
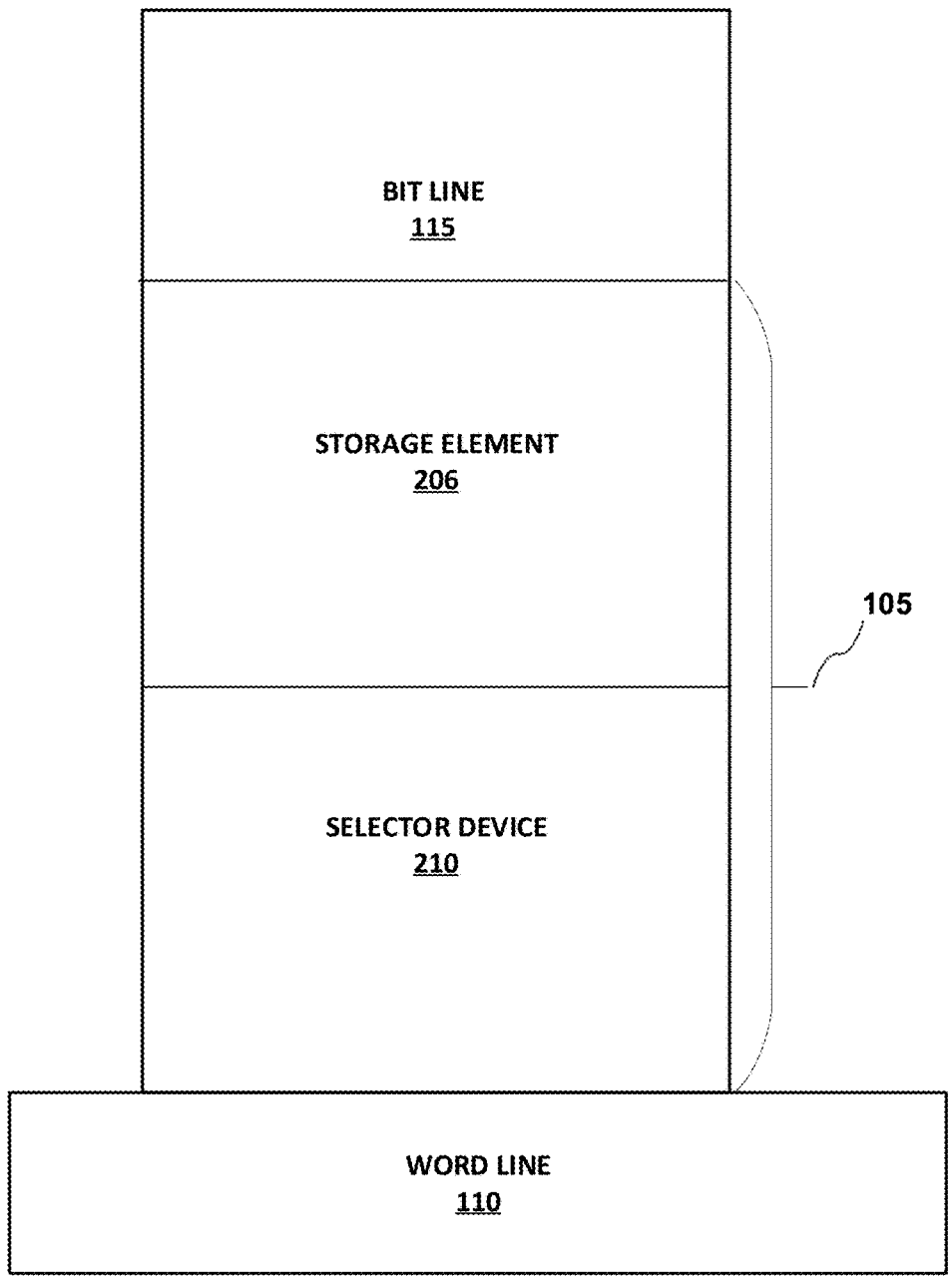
FIG. 2 is a portion of an embodiment of the cross-point memory array shown in FIG. 1.

FIG. 2 is a portion of an embodiment of the cross-point memory array 100 shown in FIG. 1 including any one of the memory cells 105 in the cross-point memory array 100. As shown in FIG. 2, the word line 110 extends parallel to the plane of the page, and the bit line 115 extends into the plane of the page, perpendicular to the word line 110. A memory cell 105 may be located at an intersection of the word line 110 and the bit line 115.

The memory cell 105 may be configured as a two-terminal device between the bit line 115 and word line 110 in some embodiments. A first logic state may be written to the memory cell 105 by applying a voltage (for example, a write pulse) across the memory cell 105 in a first polarity. A second logic state may be written to the memory cell 105 by applying a voltage (for example, a write pulse) across the memory cell 105 in a second polarity, which may be opposite to the first polarity. The memory cell 105 is read by applying a voltage (for example, a read pulse) across the terminals. In some embodiments, the memory cell 105 is read by applying a voltage across the memory cell 105 in the first polarity. In other embodiments, the memory cell 105 is read by applying a voltage across the memory cell 105 in the second polarity. The memory cell 105 may always be read with the same polarity. When the memory cell 105 is read with a voltage in the same voltage polarity with which the memory cell 105 was written, the memory cell 105 may exhibit a first threshold voltage $V_{TH}$. When the memory cell 105 is read with a voltage in the opposite voltage polarity with which the memory cell 105 was written, the memory cell may exhibit a second threshold voltage $V_{TH}$. The different threshold voltages may be used to represent different logic states.

The bit line 115 and word line 110 are conductive lines and can comprise a metal. Examples of the metal include elemental metals such as Al, Cu, Ni, Cr, Co, Ru, Rh, Pd, Ag, Pt, Au, Jr, Ta, and W; conductive metal nitrides such as TiN, TaN, WN, and TaCN; conductive metal silicides such as tantalum silicides, tungsten silicides, nickel silicides, cobalt silicides and titanium silicides; and conductive metal oxides such as $RuO_2$.

In the embodiment shown, the memory cell 105 is formed as a memory cell pillar disposed at an intersection between a bit line 115 and a word line 110. Each memory cell 105 comprises a first active element comprising a storage material ("storage element") 206 disposed over the bit line 115 and a second active element comprising a selector material ("selector device") 210 disposed over the selector device 210. In embodiments where the memory cell 105 is a phase change memory cell, the storage element 206 can include a chalcogenide material that is configured to switch between crystalline and amorphous phases via an electrical pulse applied between the bit line 115 and the word line 110 during an access operation, such as a write access operation. In some embodiments, the chalcogenide material may be a phase change material, but other materials may be used. In some embodiments, the storage element 206 includes a chalcogenide material such as an alloy including at least two of the elements within the indium(In)-antimony(Sb)-tellurium(Te) (IST) alloy system, e.g., $In_2Sb_2Te_5$, $In_1Sb_2Te_4$, $In_1Sb_4Te_7$, etc., or an alloy including at least two of the elements within the germanium(Ge)-antimony(Sb)-tellurium(Te) (GST) alloy system, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, etc.

In other embodiments, the storage element 206 can be a resistive random access memory (RRAM) storage element (for example, NiO, $HfO_2$, $ZrO_2$, $Cu_2O$, $TaO_2$, $Ta_2O_5$, $TiO_2$, $SiO_2$, $Al_2O_3$), a conductive bridge random access memory (CBRAM) storage element (for example, metal-doped chalcogenide), and/or a spin transfer torque random access memory (STT-RAM) storage element.

The storage element 206 may be written and read by varying the voltage to the selector device 210. The selector device 210 may include a two terminal device (for example, a switch), such as a diode, an ovonic threshold switch (OTS), a tunnel junction, or a mixed ionic electronic conduction switch (MIEC).

In some embodiments, the selector device 210 may also include a layer of chalcogenide material. A selector device having a chalcogenide material can sometimes be referred to as an Ovonic Threshold Switch (OTS). An OTS may include a chalcogenide composition including any one of the chalcogenide alloy systems described above for the storage element and, in addition, further include an element that can suppress crystallization, such as arsenic (As), nitrogen (N) and carbon (C), to name a few. Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se.

The memory cell 105 can additionally include one or more dielectric layers (not shown) that may be formed between the bit line, word line, the selector device 210 and the storage element 206. When included, one or more of the dielectric layers can include a material, such as carbon, that can serve simultaneously as an electrode material that can provide relatively low contact resistance between adjacent materials, as well as a diffusion barrier against intermixing, for example, between metal lines and chalcogenide elements, or between chalcogenide elements of different compositions.

Figure 3:
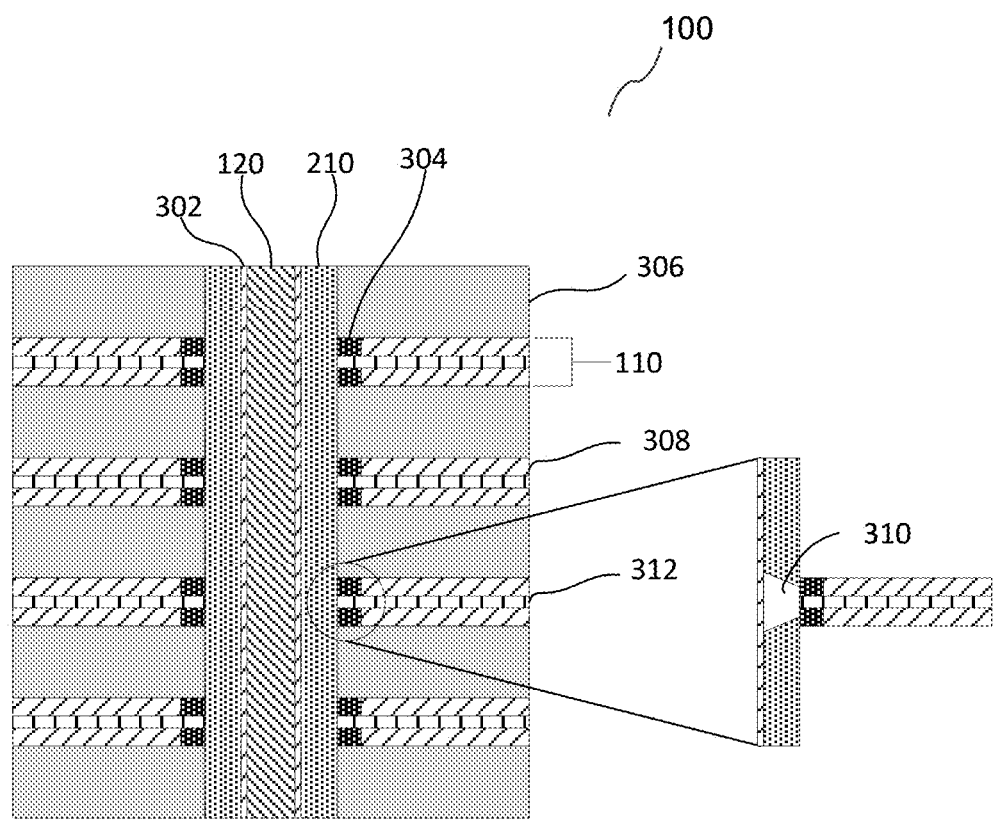
FIG. 3 illustrates an embodiment of a memory array that includes a plurality of memory cells that are stacked vertically, word lines and a bit line as described in conjunction with FIG. 2.

FIG. 3 illustrates an embodiment of a cross-point memory array 100 that includes a plurality of memory cells 105 that are stacked vertically, word lines 110 and a bit line 120 as described in conjunction with FIG. 2. Cross-point memory array 100 also includes one or more insulating layers 306 that include materials to provide dielectric isolation and increase the thermal resistance between memory cells 105. The insulating layer may include oxide or nitride materials, such as silicon oxide (e.g., $SiO_2$), aluminum oxide (e.g., $Al_2O_3$) and silicon nitride (e.g., $Si_3N_4$).

In an embodiment, selector devices 210 of memory cells 105 which may also be referred to as memory elements may be coaxial with bit line 120, that is, they may share the same axis of rotation. For example, bit line 120 may be cylindrical and the plurality of selector devices 210 may be annular and surround bit line 120.

In the embodiment shown, a dielectric layer 302 surrounds the bit line 120. The dielectric layer 302 is a thin dielectric lamina that can include oxide or nitride materials, such as silicon oxide ($SiO_2$), aluminum oxide ($Al_2O_3$), hafnium oxide ($HfO_2$) and silicon nitride ($Si_3N_4$). In an embodiment, the dielectric layer 302 is a thin layer in the range of 1-2 nanometers to allow the dielectric layer 302 to electrically conduct through a tunnel effect and to prevent possible contamination between the material (for example, tungsten (W)) in the bit line 120 and the material (for example, chalcogenide) in the selector device 210.

The word line 110 is a conductive line and can comprise three metal layers comprising a conductive material, second conductive layer 312 can comprise Carbon (C) or other conductive material. Second conductive layer 312 is sandwiched between other metal layers 308 that can comprise Tungsten (W) or other conductive material. The bit line 120 is a conductive line and can comprise a metal layer as discussed earlier in conjunction with FIG. 2.

A dielectric layer 304 surrounding the tip of the word line 110 and adjacent to the selector device 210 includes materials to provide dielectric isolation. The insulating layer may include oxide or nitride materials that do not chemically interact with the active chalcogenide material in the selector device 210, such as silicon oxide ($SiO_2$), aluminum oxide ($Al_2O_3$), hafnium oxide ($HfO_2$) and silicon nitride ($Si_3N_4$). In an embodiment, the dielectric layer 304 is about 10 nanometers (nm) thick to provide a bias between the word line (WL) and the bit line (BL). The width of the dielectric layer 304 is selected to avoid breakdown, that is to ensure that an electric field between the WL and BL is sustained to avoid an electrical breakdown that can realize a short-circuit between WL and BL.

Figure 4A:
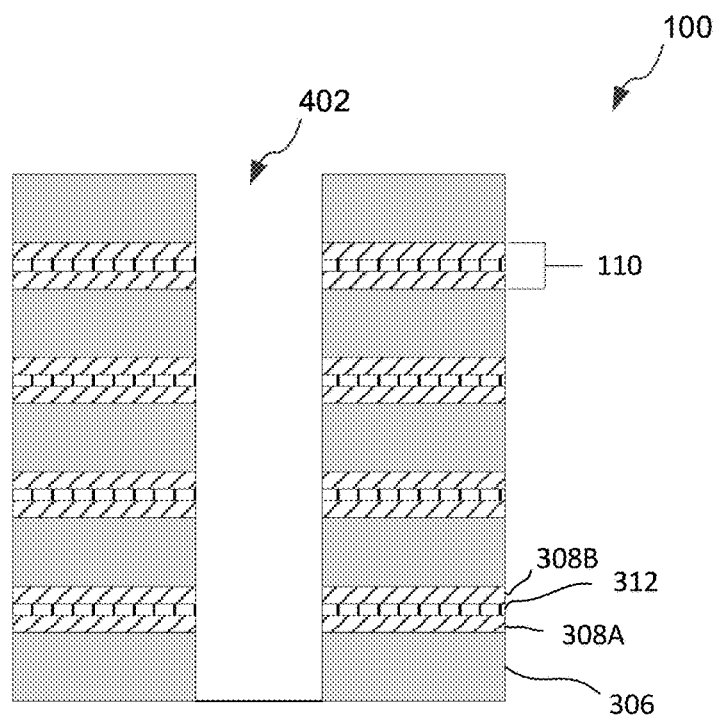
FIG. 4A and FIG. 4B show various portions of a fabrication process to form a cross-point memory array, according to an embodiment.
Figure 4B:
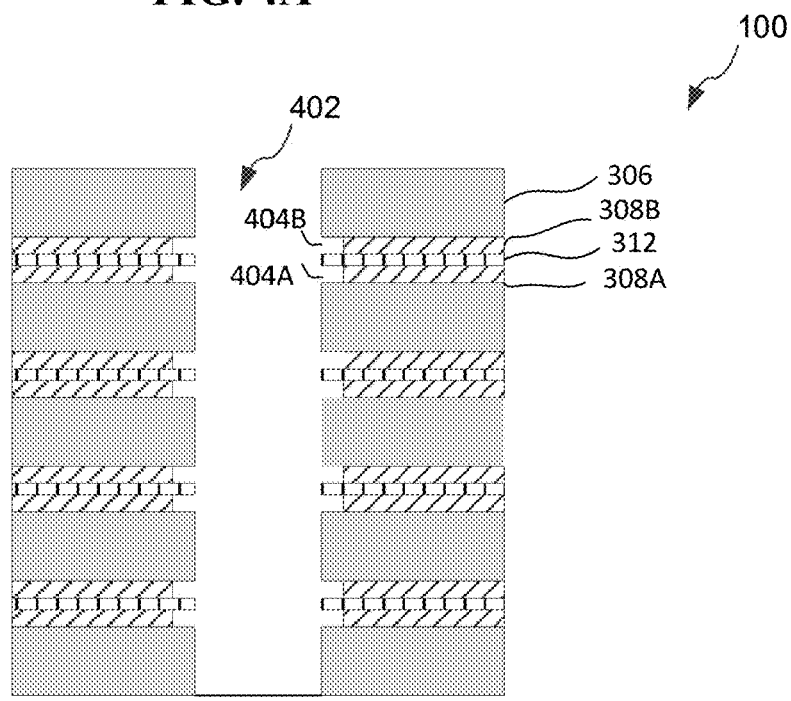

FIG. 4A and FIG. 4B show various portions of a fabrication process to form a cross-point memory array, according to an embodiment.

Although the process operations described herein may refer to particular conductor, semiconductor, or dielectric materials, such as silicon, silicon dioxide, silicon nitride, or others, a person of ordinary skill in the art will recognize that other conductor, semiconductor, and dielectric materials may be substituted and still be within a scope of the disclosed subject matter. Thus, the material choices and selections presented are merely provided as an aid in understanding one example of a fabrication process.

Further, formation and process may refer to one material placed, for example, "over" or "above" another material. Such descriptors are relative terms only and obviously depend upon an exact orientation of any resulting device. However, a person of ordinary skill in the art will readily understand the context of such relative terms upon reading and understanding the disclosure provided herein in conjunction with the respective drawings.

Materials or components in cross-point memory array 100 may be formed by depositing material using chemical vapor deposition, metal-organic chemical vapor deposition, physical vapor deposition, or atomic layer deposition. Material may be removed by etching, such as chemical or plasma etching. First, a source material is formed, and then various materials are formed over the source material The cross-point memory array 100 is fabricated on a semiconductor substrate. A semiconductor substrate can be any of various types of substrates used in the semiconductor and allied industries, such as silicon wafers, other elemental semiconductor wafers, compound semiconductor wafers, thin film head assemblies, polyethylene-terephthalate (PET) films deposited or otherwise formed with a semiconducting material layer (followed by an annealing activity, such as excimer laser annealing (ELA) in some embodiments), as well as numerous other types of substrates known independently in the art.

Insulating layer(s) 306 are formed over the substrate. A first conductive layer 308A is formed over the insulating layer(s) 306. A second conductive layer 312 is formed over the first conductive layer 308A. A third conductive layer 308B is formed over the second conductive layer 312. The three conductive layers 308A, 308B and 312 form the word line 110. Conductive layers 308A, 308B, and 312, and insulating layer 306 are repeated to form an array of memory cells. As discussed earlier, in an embodiment, the first conductive layer 308A and third conductive layer 308B can comprise Tungsten (W) and the second conductive layer 312 can comprise carbon (C).

After all layers have been formed, a trench is formed by etching a pillar opening 402 through the plurality of layers 306, 308A, 308B, 312 formed on the substrate. The pillar opening 402 can be considered to be an opening (for example, an aperture) formed at least partially through the various materials discussed above. In an embodiment, the pillar opening 402 can be formed by an anisotropic dry etch process (for example, reactive ion etch (ME) or plasma etch). In other embodiments, depending upon materials selected, the pillar opening 402 may be formed by one or more various types of chemical etchants (e.g., such as potassium hydroxide (KOH) or tetramethyl ammonium hydroxide (TMAH)), mechanical techniques, other types of ion milling, or laser ablation techniques.

The first conductive layer 308A and the third conductive layer 308B are recessed by etching or otherwise having portions removed laterally to form recesses 404A, 404B away from the sidewall of the pillar opening 402. The etching of the first conductive layer 308A and the third conductive layer 308B to form recesses 404A, 404B results in the protrusion of the second conductive layer 400 that can be employed as a tip-like contact.

An insulating material (dielectric), for example, oxide or nitride materials, such as silicon oxide ($SiO_2$), aluminum oxide ($Al_2O_3$) or silicon nitride ($Si_3N_4$) is deposited in the recesses 404A, 404B. The selector device 210 comprising a chalcogenide material or phase change material is formed on the sidewalls of the pillar opening 402 followed by a dielectric layer 302 being formed adjacent to the selector device 210, the dielectric layer 302 and the chalcogenide material are primarily or entirely formed on opposing faces of the pillar opening 402. The remaining trench (or pillar opening) 402 is filled with a conductive material to form the bit line 120 to provide the memory array discussed in conjunction with FIG. 3.

The selector device 210 comprising a chalcogenide material and the middle metal second conductive layer 312 comprise different materials which have a different composition and stoichiometry from each other. The reduction in contact area between the selector device 210 having a chalcogenide material and the word line 110 through the tip like contact of the middle metal second conductive layer 312 in the word line 110 exacerbates both the electric field and the temperature gradient that are the drivers of the stoichiometry gradient 310 (FIG. 3). This results in increasing the difference ("window") between the threshold voltages.

Figure 5:
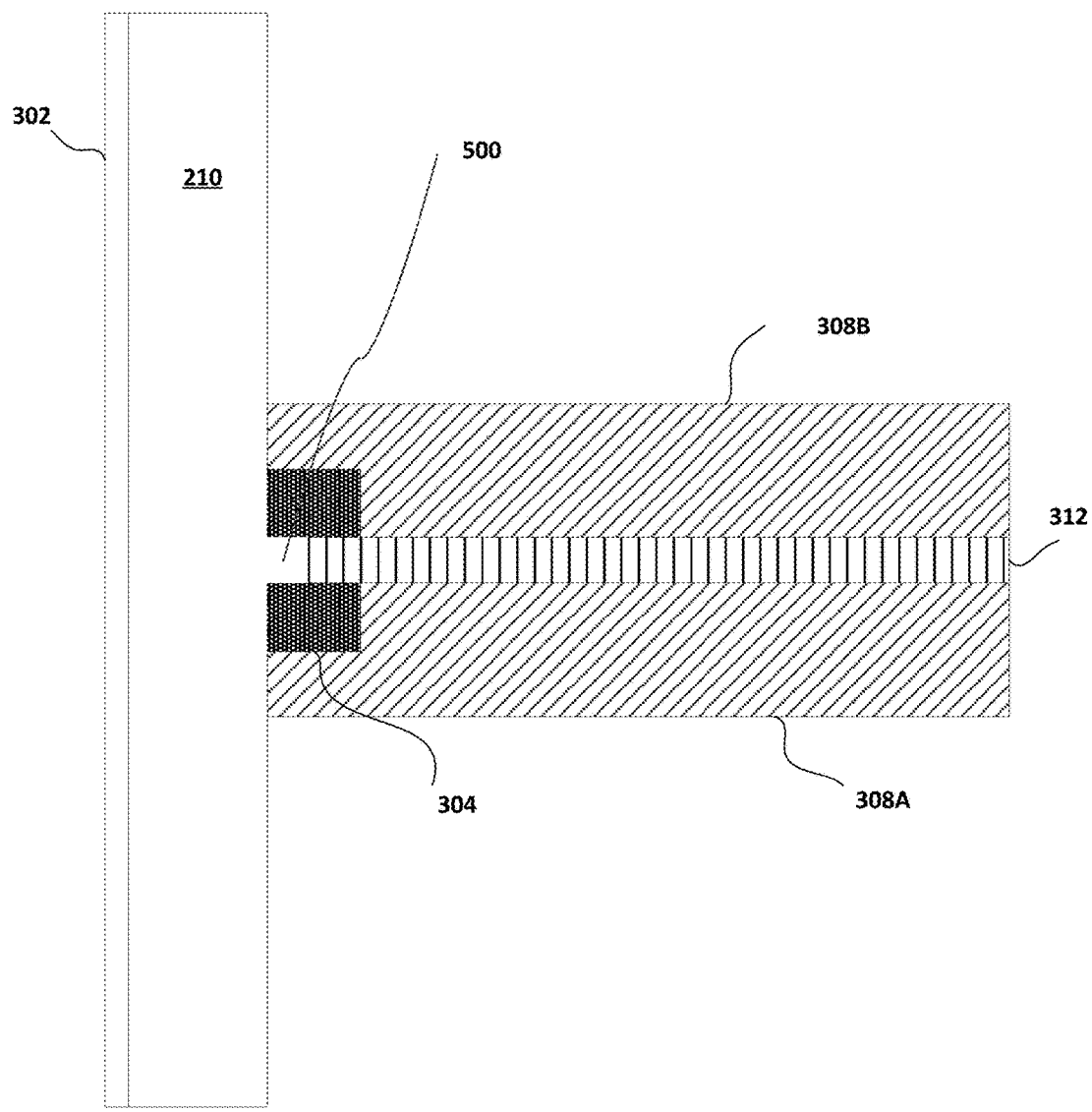
FIG. 5 shows a portion of a fabrication process to form a cross-point memory array, according to another embodiment.

FIG. 5 shows a portion of a fabrication process to form a cross-point memory array, according to another embodiment. In the embodiment shown in FIG. 5, after the insulating material (dielectric), for example, oxide or nitride materials, such as silicon oxide ($SiO_2$), aluminum oxide ($Al_2O_3$) or silicon nitride ($Si_3N_4$) is deposited in the recesses 404A, 404B as described in conjunction with FIGS. 4A and 4B, a portion of the second conductive layer 312 is recessed by etching or otherwise having portions removed laterally to form recess 500 away from the sidewall of the pillar opening 402. The selector device 210 comprising a chalcogenide material or phase change material formed on the sidewalls of the pillar opening 402 fills the recess 500 resulting in a protrusion of the chalcogenide material adjacent to the tip-like contact of the word line 110.

This embodiment further increases the difference ("window") between threshold voltages and also allows the diameter of the trench to be reduced because the width of the selector device 210 formed on the sidewalls can be reduced from the embodiment shown in FIG. 4.

Figure 6:
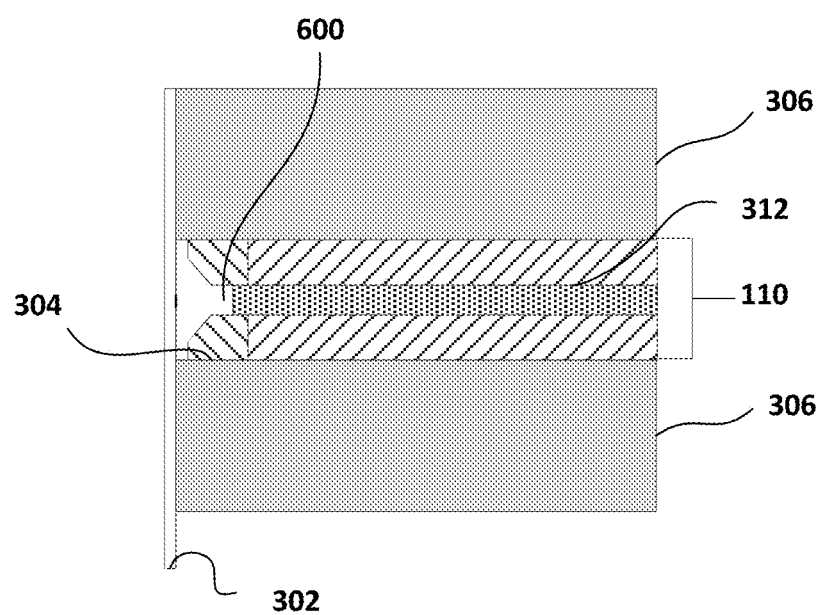
FIG. 6 shows a portion of a fabrication process to form a cross-point memory array, according to yet another embodiment.

FIG. 6 shows a portion of a fabrication process to form a cross-point memory array, according to yet another embodiment. In the embodiment shown in FIG. 6, after the insulating material in the dielectric layer 304, for example, oxide or nitride materials, such as silicon oxide ($SiO_2$), aluminum oxide ($Al_2O_3$) or silicon nitride ($Si_3N_4$) is deposited in the recesses 404A, 404B as described in conjunction with FIGS. 4A and 4B, a portion of the second conductive layer 312 is recessed by etching or otherwise having portions removed laterally. In addition, a portion of the insulator material in the dielectric layer 304 and the dielectric material in the insulating layers 306 is recessed by etching or otherwise having portions removed laterally to form funnel shaped recess 600 away from the sidewall of the pillar opening 402. In an embodiment, the width of the word line 110 is about 30 nanometers, the width of the insulating material in the insulating layers 306 at top and bottom of the word line 110 is about 30 nanometers, and insulating material in the dielectric layer 304 is about 12 nanometers in height and width.

The selector device 210 comprising a chalcogenide material or phase change material formed on the sidewalls of the pillar opening 402 fills the funnel shaped recess 600 resulting in a protrusion of the chalcogenide material adjacent to the tip-like contact of the word line 110. This allows a further scaling of the diameter of the trench where the material of the selector device 210 aligns with the insulating material in the insulating layers 306 at top and bottom of the conductive layers 308A, 308B, 312. This embodiment further increases the difference ("window") between threshold voltages.

Figure 7:
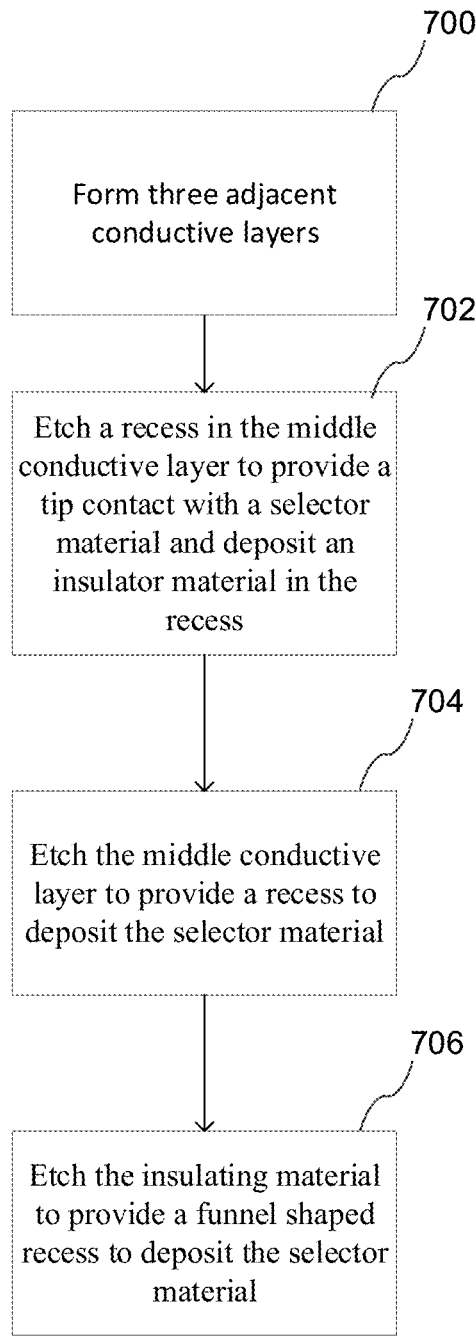
FIG. 7 is a flowgraph illustrating a method for forming a tip-contact controlled three dimensional vertical self select memory.

FIG. 7 is a flowgraph illustrating a method for forming a tip-contact controlled three dimensional vertical self select memory.

At block 700, as discussed in conjunction with FIG. 3 and FIGS. 4A and 4B, word line 110 is formed by forming a first conductive layer 308A over insulating layer(s) 306, a second ("middle") conductive layer 312 over the first conductive layer 308A and a third conductive layer 308B over the second conductive layer 312. Processing continues with block 702.

At block 702, a recess is etched in the middle second conductive layer 312 to provide a tip contact with a selector device 210 comprising a chalcogenide material and a dielectric layer 304 comprising an insulator material is deposited in the recess. Processing is complete for the embodiment described in conjunction with FIG. 3 and FIGS. 4A and 4B.

At block 704, the middle second conductive layer 312 is etched to provide a recess 500. The selector device 210 comprising a chalcogenide material is deposited in the recess 500. Processing is complete for the embodiment described in conjunction with FIG. 5.

At block 706, the insulator material in the dielectric layer 304 is etched to provide a funnel shaped recess 600. The selector device 210 comprising a chalcogenide material is deposited in the funnel shaped recess. The selector device 210 comprising a chalcogenide material aligns with the dielectric layer 302 at the sidewall of the pillar opening 402. Processing is complete for the embodiment described in conjunction with FIG. 6.

Figure 8:
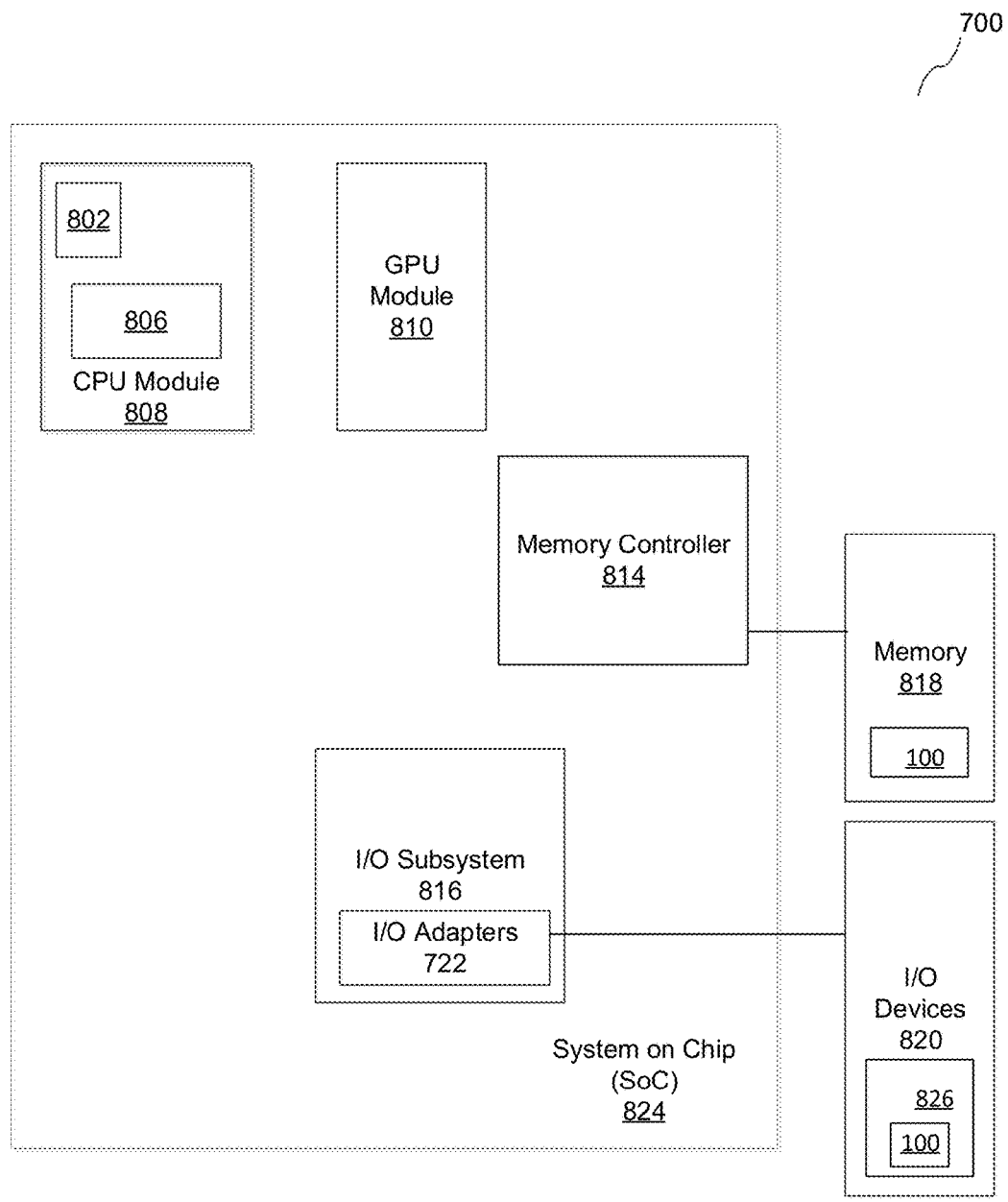
FIG. 8 is a block diagram of an embodiment of a computer system 800 that includes a tip-contact controlled three dimensional vertical self select memory.

FIG. 8 is a block diagram of an embodiment of a computer system 800. Computer system 800 may correspond to a computing device including, but not limited to, a server, a workstation computer, a desktop computer, a laptop computer, and/or a tablet computer.

The computer system 800 includes a system on chip (SOC or SoC) 824 which combines processor, graphics, memory, and Input/Output (I/O) control logic into one SOC package. The SOC 104 includes at least one Central Processing Unit (CPU) module 808, a memory controller 814, a Graphics Processor Unit (GPU) 810, and an Input/Output (I/O) System 816. Although not shown, each core 802 may internally include one or more instruction/data caches, execution units, prefetch buffers, instruction queues, branch address calculation units, instruction decoders, floating point units, retirement units, etc. The CPU 808 may correspond to a single core or a multi-core general purpose processor, according to one embodiment.

The Graphics Processor Unit (GPU) 810 may include one or more GPU cores and a GPU cache which may store graphics related data for the GPU core. The GPU core may internally include one or more execution units and one or more instruction and data caches. Additionally, the GPU 810 may contain other graphics logic units that are not shown in FIG. 8, such as one or more vertex processing units, rasterization units, media processing units, and codecs.

Within the I/O subsystem 816, one or more I/O adapter(s) 822 are present to translate a host communication protocol utilized within the core(s) 802 to a protocol compatible with particular I/O devices. Some of the protocols that adapters may be utilized for translation include Peripheral Component Interconnect (PCI)-Express (PCI-E), 3.0; Universal Serial Bus (USB), 3.0; Serial Advanced Technology Attachment (SATA), 3.0; Small Computer System Interface (SCSI), Ultra-640; and Institute of Electrical and Electronics Engineers (IEEE) 1594 "Firewire.

The I/O adapter(s) 822 may communicate with external I/O devices 820 which may include, for example, user interface device(s) including a display, a touch-screen display, printer, keypad, keyboard, communication logic, wired and/or wireless, storage device(s) 826 including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. Additionally, there may be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

The memory may be a cross-point memory array 100 that includes a plurality of memory cells as discussed in conjunction with FIGS. 3-6.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations without departing from their scope.

Therefore, the illustrations and examples herein should be construed in an illustrative, and not a restrictive sense. The scope of the invention should be measured solely by reference to the claims that follow.

According to various embodiments, the present disclosure describes a number of examples.

Example 1 may be a method of forming a memory, comprising: depositing a first conductive layer comprising a first conductive material; depositing a second conductive layer comprising a second conductive material on top of the second conductive layer; depositing a third conductive layer comprising the first conductive material on top of the second conductive layer; etching a recess in the second conductive layer to provide a tip contact with a selector material; and depositing an insulating material in the recess to form an insulating layer.

Example 2 may include the method of example 1, further comprising etching the second conductive layer to provide a second recess to deposit the selector material; and depositing the selector material in the second recess.

Example 3 may include the method of Example 1 and Example 2, further comprising etching a funnel shaped recess by etching a portion of the first conductive layer, a portion of the third conductive layer and a portion of the insulating layer; and depositing the selector material in the funnel shaped recess.

Example 4 may include the method of Examples 1-2, wherein the selector material is aligned with a dielectric layer adjacent to a sidewall of a pillar opening and the first and second conductive layers.

Example 5 may include the method of Examples 1-2 wherein the first conductive layer and third conductive layer is tungsten and the second conductive layer is carbon.

Example 6 may include the method of Examples 1-2 and Example 4, wherein the dielectric layer is aluminum oxide.

Example 7 may include the method of Examples 1-2 and Example 4, wherein the dielectric layer is about 10 nanometers (nm) thick.

Example 8 may be a memory comprising: a first conductive layer comprising a first conductive material; a second conductive layer comprising a second conductive material on top of the second conductive layer; a third conductive layer comprising the first conductive material on top of the second conductive layer; and an insulating layer formed in a recess in the second conductive layer to provide a tip contact with a selector material.

Example 9 may include the memory of Example 8, further comprising: a selector material formed in a second recess in the second conductive layer.

Example 10 may include the memory of Example 8 and Example 9, further comprising: a selector material formed in a funnel shaped recess in the first conductive layer, a portion of the third conductive layer and a portion of the insulating layer.

Example 11 may include the memory of Example 8 and Example 9, wherein the selector material is aligned with a dielectric layer adjacent to a sidewall of a pillar opening and the first and second conductive layers.

Example 12 may include the memory of Example 8 and Example 9 and Example 11, wherein the insulating layer comprises is aluminum oxide.

Example 13 may include the memory of Example 8 and Example 9 and Example 11 and Example 12, wherein the insulating layer is about 10 nanometers (nm) thick.

Example 14 may include a system including a processor; and a memory communicatively coupled to the memory, the memory comprising: a first conductive layer comprising a first conductive material; a second conductive layer comprising a second conductive material on top of the second conductive layer; a third conductive layer comprising the first conductive material on top of the second conductive layer; and an insulating layer formed in a recess in the second conductive layer to provide a tip contact with a selector material.

Example 15 may include the system of Example 14, further comprising: a selector material formed in a second recess in the second conductive layer.

Example 16 may include the system of Example 14 and Example 15, further comprising: the selector material formed in a funnel shaped recess in the first conductive layer, a portion of the third conductive layer and a portion of the insulating layer.

Example 17 may include the system of Example 14 and Example 15, wherein the selector material is aligned with a dielectric layer adjacent to a sidewall of a pillar opening and the first and second conductive layers.

Example 18 may include the system of Example 14 and Example 15 and Example 17, wherein the dielectric layer comprises aluminum oxide.

Example 19 may include the system of Example 14 and Example 15 and Example 17, wherein the dielectric layer is about 10 nanometers (nm) thick.

Example 20 may include a device comprising means to perform any one of Examples 1 to 7.

What is claimed is:

1. A memory comprising:
    a first conductive layer comprising a first conductive material;
    a second conductive layer comprising a second conductive material on top of the first conductive layer;
    a third conductive layer comprising the first conductive material on top of the second conductive layer; and
    an insulating layer formed in a first recess in the first conductive layer and a second recess in the third conductive layer to provide a tip contact with a selector material and the second conductive layer, the selector material formed in a third recess in the second conductive layer, a funnel shaped recess in the first conductive layer, a portion of the third conductive layer and a portion of the insulating layer.

2. The memory of claim 1, wherein the selector material is aligned with a dielectric layer adjacent to a sidewall of a pillar opening and the first and second conductive layers.

3. The memory of claim 2, wherein the insulating layer comprises aluminum oxide.

4. The memory of claim 3, wherein the insulating layer is about 10 nanometers (nm) thick.

5. A system comprising:
    a processor; and
    a memory communicatively coupled to the memory, the memory comprising:
        a first conductive layer comprising a first conductive material;
        a second conductive layer comprising a second conductive material on top of the second conductive layer;
        a third conductive layer comprising the first conductive material on top of the first conductive layer; and
        an insulating layer formed in a first recess in the first conductive layer and a second recess in the third conductive layer to provide a tip contact with a selector material and the second conductive layer, the selector material formed in a third recess in the second conductive layer, a funnel shaped recess in the first conductive layer, a portion of the third conductive layer and a portion of the insulating layer.

6. The system of claim 5, wherein the selector material is aligned with a dielectric layer adjacent to a sidewall of a pillar opening and the first and second conductive layers.

7. The system of claim 6, wherein the dielectric layer comprises aluminum oxide.

8. The system of claim 6, wherein the dielectric layer is about 10 nanometers (nm) thick.

* * * * *